(12) United States Patent
Kim et al.

(10) Patent No.: US 7,391,616 B2
(45) Date of Patent: Jun. 24, 2008

(54) PLASMA DISPLAY DEVICE

(75) Inventors: Ki-Jung Kim, Suwon-si (KR); Won-Kyu Bang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 226 days.

(21) Appl. No.: 11/174,734

(22) Filed: Jul. 6, 2005

(65) Prior Publication Data

US 2006/0077619 A1 Apr. 13, 2006

(30) Foreign Application Priority Data

Oct. 11, 2004 (KR) .................... 10-2004-0080872

(51) Int. Cl.
*H05K 7/20* (2006.01)
*H01L 23/34* (2006.01)
*H01J 7/24* (2006.01)

(52) U.S. Cl. .............. 361/719; 361/710; 257/718; 257/719; 257/712; 165/80.3; 174/16.3; 313/46; 313/582

(58) Field of Classification Search ............ 361/687, 361/710, 719; 257/718–719; 165/80.3; 174/16.3
See application file for complete search history.

(56) References Cited

U.S. PATENT DOCUMENTS

| | | | |
|---|---|---|---|
| 5,005,113 A * | 4/1991 | Ohtuka et al. | ............ 363/37 |
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Sinoda et al. | |
| 5,724,054 A | 3/1998 | Shinoda | |
| 5,786,794 A | 7/1998 | Kishi et al. | |

(Continued)

FOREIGN PATENT DOCUMENTS

JP 02-148645 6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Jayprakash Gandhi
*Assistant Examiner*—Zachary M Pape
(74) *Attorney, Agent, or Firm*—Robert E. Bushnell, Esq.

(57) ABSTRACT

A plasma display device includes: a Plasma Display Panel (PDP); a chassis base adapted to support the PDP attached to one surface thereof, a plurality of Integrated Circuit (IC) modules respectively included on driving circuit boards attached to another surface of the chassis base and adapted to control the PDP; and a reinforcing member arranged on the chassis base, one surface of each of the IC modules being in contact with the reinforcing member. The integrated circuit module is attached to the reinforcing member which reinforces the mechanical strength of the chassis base, so that a heat sink is not needed. The thickness of a plasma display device is thereby reduced and the appearance of the plasma display device is improved.

12 Claims, 3 Drawing Sheets

U.S. PATENT DOCUMENTS

| | | |
|---|---|---|
| 5,952,782 A | 9/1999 | Nanto |
| 6,262,902 B1 * | 7/2001 | Watanabe et al. ............ 363/74 |
| RE37,444 E | 11/2001 | Kanazawa |
| 6,630,916 B1 | 10/2003 | Shinoda |
| 6,657,620 B2 * | 12/2003 | Oishi et al. ................ 345/204 |
| 6,707,436 B2 | 3/2004 | Setoguchi et al. |
| 7,164,586 B2 * | 1/2007 | Lin ........................... 361/714 |
| 2003/0020152 A1 | 1/2003 | Hirokazu et al. |
| 2004/0036819 A1 * | 2/2004 | Ryu et al. .................... 349/58 |
| 2005/0078445 A1 * | 4/2005 | Chen et al. ................. 361/685 |
| 2005/0259401 A1 * | 11/2005 | Han et al. ................... 361/704 |
| 2006/0158853 A1 * | 7/2006 | Jeong ......................... 361/704 |
| 2006/0268525 A1 * | 11/2006 | Jeong ......................... 361/719 |
| 2006/0291153 A1 * | 12/2006 | Bae ............................ 361/681 |

FOREIGN PATENT DOCUMENTS

| | | |
|---|---|---|
| JP | 03-059334 | 6/1991 |
| JP | 08-023182 | 1/1996 |
| JP | 2845183 | 10/1998 |
| JP | 2917279 | 4/1999 |
| JP | 2001-013883 | 1/2001 |
| JP | 2001-043804 | 2/2001 |
| JP | 2001-325888 | 11/2001 |
| JP | 2002-124607 | 4/2002 |
| JP | 2002-351346 | 6/2002 |

* cited by examiner

PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on 11 Oct. 2004 and there duly assigned Serial No. 10-2004-0080872.

BACKGROUND OF THE INVENTION

1. Field of the Invention

The present invention relates to a plasma display device, and more particularly, to a plasma display device having a small thickness and an excellent appearance by bringing an integrated circuit module into contact with a reinforcing member to reinforce the mechanical strength of a chassis base.

2. Description of the Related Art

A plasma display device includes a Plasma Display Panel (PDP) that displays images using a plasma generated by gas discharge, a chassis base that supports the PDP, and a plurality of driving circuit boards that are arranged on a surface of the chassis base opposite to the PDP and connected to display electrodes and address electrodes of the PDP via flexible printed circuits and connectors.

Since the PDP is formed by bonding two glass substrates with a discharge space interposed therebetween, it has low mechanical impact strength. Therefore, in order to support the PDP, the chassis base is made of a metallic material having a high mechanical strength. The chassis base supports the driving circuit boards, acts as a heat sink of the PDP, and reduces ElectroMagnetic Interference (EMI), in addition to maintaining the mechanical strength of the PDP.

In order for the chassis base to achieve the above-mentioned functions, the PDP is attached to a front surface of the chassis base with an adhesive interposed therebetween, and the driving circuit boards are attached to a rear surface of the chassis base. These driving circuit boards are attached by setscrews to a plurality of bosses formed on the rear surface of the chassis base.

The driving circuit boards each have a hybrid circuit module and circuits for controlling display electrodes and address electrodes of the PDP. The hybrid circuit module generates a large amount of heat due to a high frequency switching operation. Therefore, the hybrid circuit module has a heat sink on one surface thereof to dissipate heat generated during the switching operation.

However, since the heat sink does not have sufficient radiating ability to absorb and dissipate heat generated by the hybrid circuit module, it is necessary to increase a radiating area in order to improve radiation efficiency. However, the width and height of the heat sink increases, which results in an increase in the thickness of the plasma display device.

SUMMARY OF THE INVENTION

An object of the present invention is to provide a plasma display device having a small thickness and excellent appearance by bringing an integrated circuit module into contact with a reinforcing member to reinforce the mechanical strength of a chassis base and to dissipate heat generated by the integrated circuit module without using a heat sink.

According to one aspect of the present invention, a plasma display device is provided, the device including: a Plasma Display Panel(PDP); a chassis base adapted to support the PDP attached to one surface thereof; a plurality of Integrated Circuit (IC) modules respectively included on driving circuit boards attached to another surface of the chassis base and adapted to control the PDP; and a reinforcing member arranged on the chassis base, one surface of each of the IC modules being in contact with the reinforcing member.

The IC modules preferably include hybrid IC modules.

The IC modules preferably alternatively include intelligent power modules.

Each driving circuit board preferably further includes a through hole therein.

Each IC module is preferably attached to a side of the driving circuit board opposite to the chassis base and is preferably in contact with the reinforcing member exposed by the through hole.

The plasma display device preferably further includes a thermal conductive material layer arranged between each IC module and the reinforcing member.

The thermal conductive material layer preferably includes grease or a silicon sheet.

The plasma display device preferably further comprising a plurality of radiating portions arranged on a side of the reinforcing member facing the chassis base.

The IC module is preferably attached to a side of the driving circuit board facing the chassis base.

The plasma display device preferably further includes a thermal conductive material layer arranged between the IC module and the reinforcing member.

The plasma display device preferably further includes a plurality of radiating portions arranged on a side of the reinforcing member facing the chassis base.

BRIEF DESCRIPTION OF THE DRAWINGS

A more complete appreciation of the present invention, and many of the attendant advantages thereof, will be readily apparent as the present invention becomes better understood by references to the following detailed description when considered in conjunction with the accompanying drawings in which like reference symbols indicate the same or similar components, wherein.

DETAILED DESCRIPTION OF THE INVENTION

Hereinafter, exemplary embodiments of the present invention are described with reference to the accompanying drawings.

Figure 1:
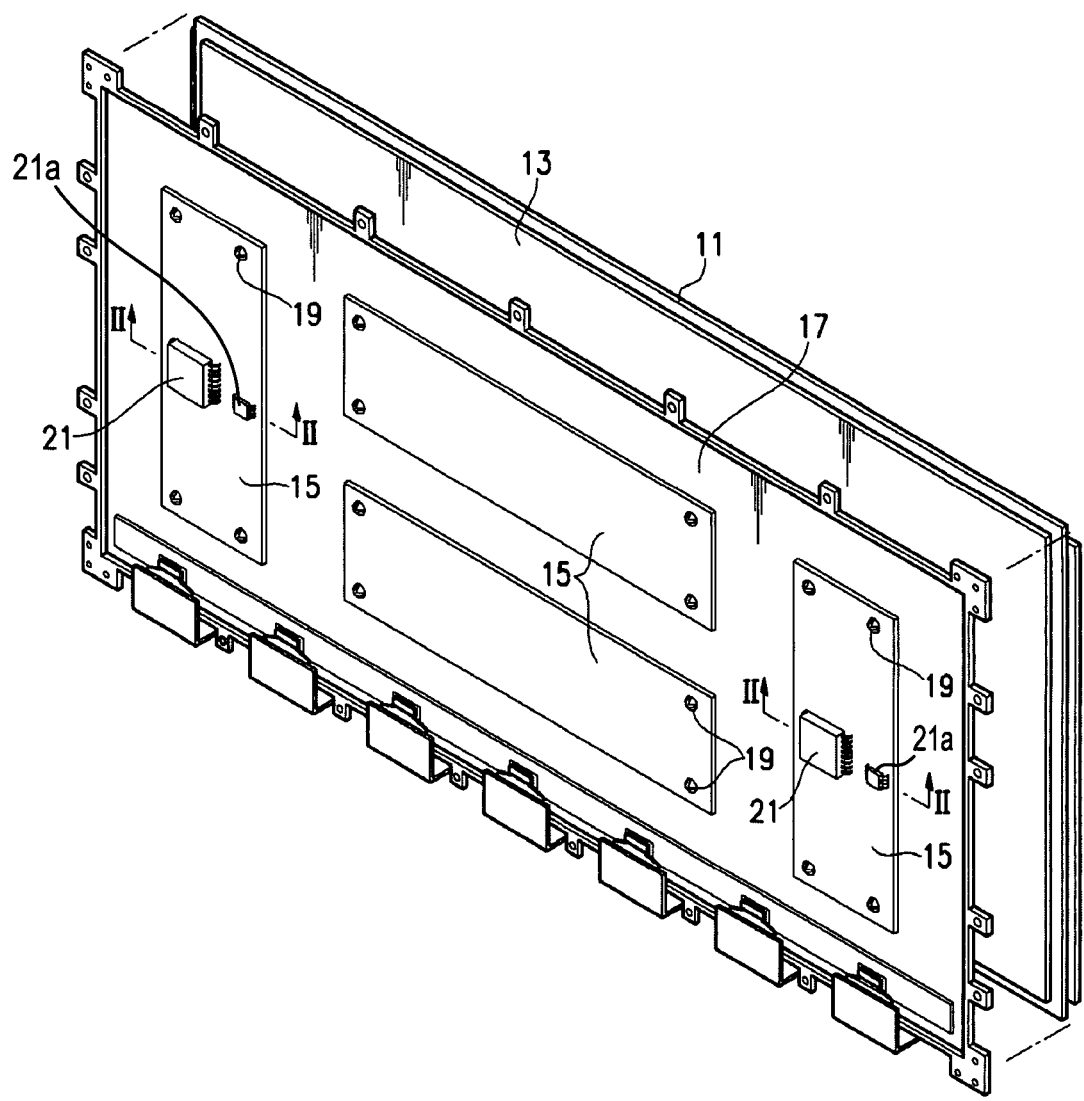
FIG. 1 is an exploded perspective view of a plasma display device according to a first embodiment of the present invention.

FIG. 1 is an exploded perspective view of a plasma display device according to a first embodiment of the present invention.

The plasma display device includes a PDP 11 for displaying images using a gas discharge, a radiating sheet 13 that is provided at a rear surface of the PDP 11 to dissipate heat generated in the plane direction by the gas discharge of the PDP 11, driving circuit boards 15 electrically connected to the PDP 11 to drive the PDP 11 (electrical connections are not shown), and a chassis base 17 to support the PDP 11 attached to its front surface and the driving circuit boards 15 attached to its rear surface.

In the above-mentioned structure, the PDP 11 displays an image using a gas discharge, and the present invention relates to the connecting relationship between the PDP 11 and other components. Therefore, a detailed description of the PDP 11 has been omitted herein.

The radiating sheet 13 is provided at the rear surface of the PDP 11 to dissipate heat generated in the plane direction by the gas discharge of the PDP 11. The radiating sheet 13 can be made of an acryl-based radiating material, a graphite-based radiating material, a metal-based radiating material, or a carbon nanotube-based radiating material.

Figure 2:
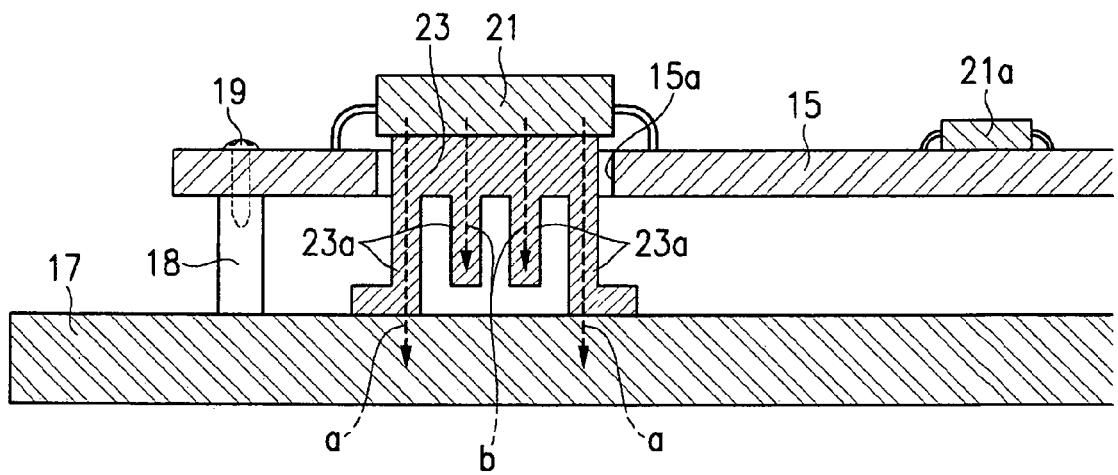
FIG. 2 is a cross-sectional view taken along the line II-II of FIG. 1.

The chassis base 17 supports the rear surface of the PDP 11 with the radiating sheet 13 interposed therebetween, and the driving circuit boards 15 are attached to another surface of the chassis based 17 opposite to the PDP supporting surface. As shown in FIG. 2, the driving circuit boards 15 can be attached by setscrews 19 to bosses 18 provided on the chassis base 17. In addition, the driving circuit boards 15 each include various circuits and an integrated circuit module to control display electrodes (not shown) and address electrodes (not shown) of the PDP 11. In this embodiment, a hybrid circuit module 21 is used as an illustrative example of the integrated circuit module. However, an intelligent power module can be used as the integrated circuit module. In addition, a plurality of the hybrid circuit modules 21 can be used, but only one hybrid circuit module 21 is shown in FIG. 1 for the convenience of explanation. An additional circuit element 21*a* is shown for illustrative purposes.

Furthermore, the PDP 11 is attached to one surface of the chassis base 17, and the driving circuit boards 15 are attached to the other surface thereof, as shown in FIG. 2. Therefore, a large load is applied to the chassis base 17. Thus, reinforcing members 23 are provided on the chassis base 17 to ensure sufficient mechanical strength to withstand the load.

One surface of the hybrid circuit module 21 is attached to the reinforcing member 23. As described above, the reinforcing member 23 both reinforces the mechanical strength of the chassis base 17 and dissipates heat generated by the hybrid circuit module 21. That is, the reinforcing member 23 having the hybrid circuit module 21 attached thereto dissipates heat generated by the hybrid circuit module 21 when electrodes corresponding to a reset period, a scanning period, and a holding period are selected and then proper pulse waveforms are supplied to the selected electrodes when the PDP 11 is driven. The hybrid circuit module 21 is composed of a flat metal substrate (not shown) provided parallel to the driving circuit board 15, a wiring pattern formed on the metal substrate with an insulating layer interposed therebetween, a plurality of elements formed in the wiring pattern, and a resin layer (not shown) covering the elements.

The hybrid circuit module 21 can be mounted on the reinforcing member 23 by various methods. Referring to FIG. 2, a through hole 15*a* is provided in the driving circuit board 15, and the hybrid circuit module 21 is provided opposite to the chassis base 17 with the through hole 15*a* of the driving circuit board interposed therebetween. That is, the hybrid circuit module 21 provided on a side of the driving circuit board 15 opposite to the chassis base 17 is attached to the reinforcing member 23 passing through the through hole 15*a*. In other words, one surface of the reinforcing member 23 is arranged in the through hole 15*a*, and the hybrid circuit module 21 is attached to the one surface of the reinforcing member passing through the through hole 15*a*. Various elements, including the hybrid circuit module 21, are attached to the side of the driving circuit module 15 opposite to the chassis base 17, thereby forming a circuit for the driving circuit board 15.

In this way, heat can be effectively dissipated from the reinforcing member 23 and the chassis base 17 without separately providing a heat sink to dissipate heat generated by the hybrid circuit module 21. As a result, the thickness of the plasma display device of the present invention is reduced by a thickness corresponding to the height of the heat sink, and thus it is possible to improve the appearance of a plasma display device.

Figure 3:
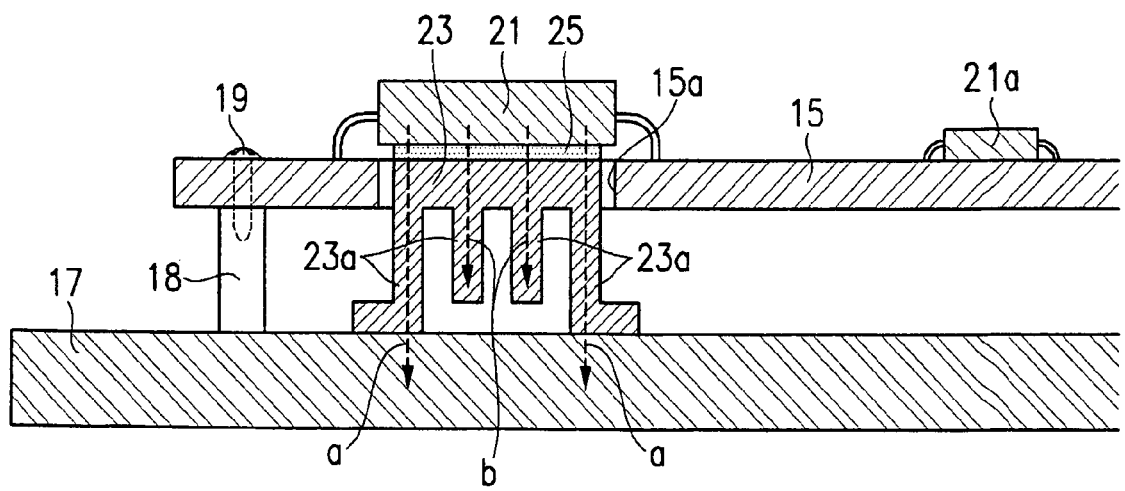
FIG. 3 is a cross-sectional view of an integrated circuit module mounting portion of a PDP according to a second embodiment of the present invention.

Furthermore, according to a second embodiment of the present invention, a thermal conductive material layer 25 is provided between the reinforcing member 23 and the hybrid circuit module 21, as shown in FIG. 3. The thermal conductive material layer 25 prevents an air layer between the reinforcing member 23 and the hybrid circuit module 21 to improve the thermal conductivity therebetween. The thermal conductive material layer 25 can be made of, for example, grease or a silicon sheet.

Furthermore, the reinforcing member 23 has a plurality of radiating portions 23*a* provided on a side thereof facing the chassis base 17 to dissipate heat by thermal conduction a and convection b.

Figure 4:
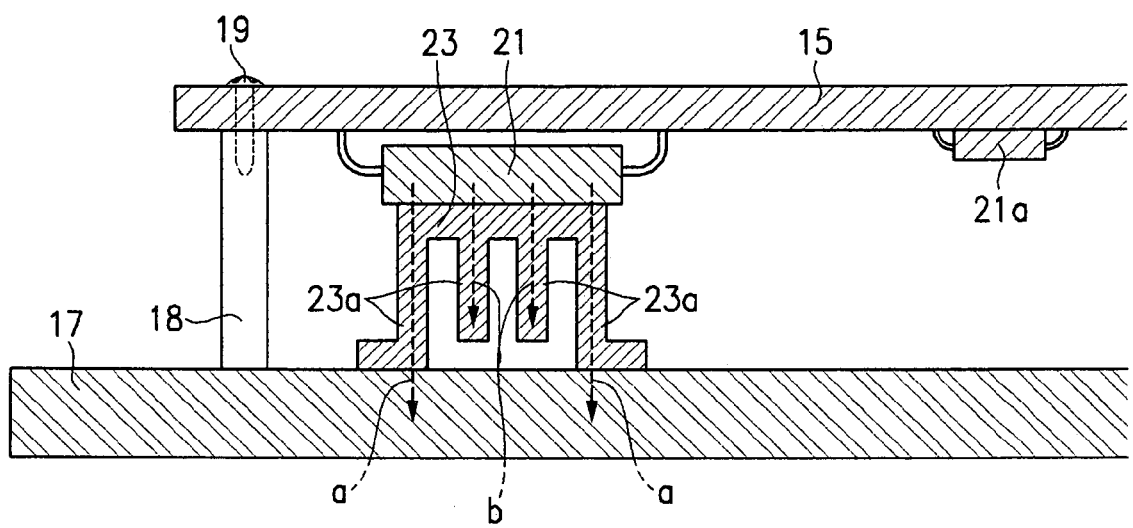
FIG. 4 a cross-sectional view of an integrated circuit module mounting portion of a PDP according to a third embodiment of the present invention.
Figure 5:
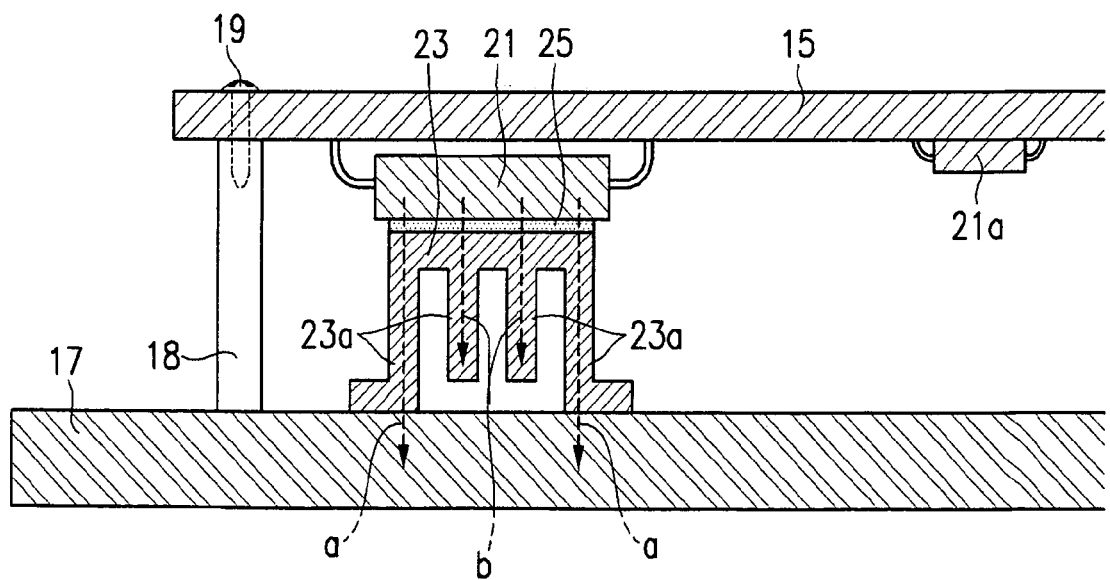
FIG. 5 is a cross-sectional view of an integrated circuit module mounting portion of a PDP according to a fourth embodiment of the present invention.

Third and fourth embodiments of FIGS. 4 and 5 correspond to the first and second embodiments, respectively. In the third and fourth embodiments, a description of the same components as those in the first and second embodiments has been omitted, and only components different from those in the first and second embodiments are described.

As shown in FIGS. 4 and 5, the hybrid circuit module 21 can be arranged on a side of the driving circuit board 15 facing the chassis base 17, and then the reinforcing member 23 can be attached thereto. The structures of FIGS. 4 and 5 are respectively formed by mounting, on the chassis base 17, the driving circuit board 15, which is the same as that of FIGS. 2 and 3 except that the through hole 15*a* is not provided, with the hybrid circuit module 21 facing the chassis base 17. Since these structures do not have the through holes 15*a*, it is possible to easily manufacture the driving circuit board 15.

Furthermore, the thermal conductive material layer 25 can be provided between the hybrid circuit module 21 and the reinforcing member 23, and the reinforcing member 23 can have a plurality of radiating portions 23 provided on a side thereof facing the chassis base 17. The thermal conductive material layer 25 of the fourth embodiment is arranged between the driving circuit board 15 and the chassis base 17, and the thermal conductive material layer 25 of the second embodiment is arranged on a side of the driving circuit board 15 opposite to the chassis base 17. In both cases, the thermal conductive material layers 25 have the same heat conduction effect.

Although exemplary embodiments of the present invention have been described herein, it is to be understood that the present invention is not limited to the above-mentioned embodiments, and that various changes and modifications can be made without departing from the scope and spirit of the invention as defined by the appended claims. In addition, it goes without saying that these modifications and changes are also included in the scope of the present invention.

As described above, according to a plasma display device according to the present invention, a hybrid circuit module is mounted on a reinforcing member of a chassis base, so that heat generated from the hybrid circuit module is dissipated by convection occurring in the reinforcing member, and is also transmitted to the chassis base to be dissipated by the chassis base. Therefore, it is possible to improve the reliability of heat radiation by the hybrid circuit module. In addition, since a heat sink is not needed, the thickness of a plasma display device is reduced, which makes it possible to improve the appearance of the plasma display device.

What is claimed is:

1. A plasma display device, comprising:
   a Plasma Display Panel (PDP);
   a chassis base adapted to support the PDP attached to one surface thereof;
   a plurality of Integrated Circuit (IC) modules respectively included on driving circuit boards attached to another surface of the chassis base and adapted to control the PDP; and
   a reinforcing member arranged between the chassis base and at least one of the IC modules, one surface of the at least one of the IC modules being in thermal contact with the reinforcing member;
   wherein each driving circuit board further comprises a through hole therein; and
   wherein each IC module is attached to a side of the driving circuit board opposite to the chassis base and is in contact with the reinforcing member exposed by the through hole.

2. The plasma display device according to claim 1, wherein the IC modules comprise hybrid IC modules.

3. The plasma display device according to claim 1, wherein the IC modules comprise intelligent power modules.

4. The plasma display device according to claim 1, further comprising a thermal conductive material layer arranged between each IC module and the reinforcing member.

5. The plasma display device according to claim 4, wherein the thermal conductive material layer comprises grease or a silicon sheet.

6. The plasma display device according to claim 1, further comprising a plurality of radiating portions arranged on a side of the reinforcing member facing the chassis base.

7. A plasma display device, comprising:
   a Plasma Display Panel(PDP);
   a chassis base adapted to support the PDP attached to one surface thereof;
   a plurality of Integrated Circuit (IC) modules respectively included on driving circuit boards attached to another surface of the chassis base and adapted to control the PDP; and
   a reinforcing member arranged between the chassis base and at least one of the IC modules, one surface of the at least one of the IC modules being in thermal contact with the reinforcing member;
   wherein the IC module is attached to a side of the driving circuit board facing the chassis base; and
   further comprising a thermal conductive material layer arranged between the IC module and the reinforcing member.

8. The plasma display device according to claim 7, wherein the IC modules comprise hybrid IC modules.

9. The plasma display device according to claim 7, wherein the IC modules comprise intelligent power modules.

10. A plasma display device, comprising:
    a Plasma Display Panel(PDP);
    a chassis base adapted to support the PDP attached to one surface thereof;
    a plurality of Integrated Circuit (IC) modules respectively included on driving circuit boards attached to another surface of the chassis base and adapted to control the PDP; and
    a reinforcing member arranged between the chassis base and at least one of the IC modules, one surface of the at least one of the IC modules being in thermal contact with the reinforcing member;
    wherein the IC module is attached to a side of the driving circuit board facing the chassis base; and
    further comprising a plurality of radiating portions arranged on a side of the reinforcing member facing the chassis base.

11. The plasma display device according to claim 10, wherein the IC modules comprise hybrid IC modules.

12. The plasma display device according to claim 10, wherein the IC modules comprise intelligent power modules.

* * * * *